(12) United States Patent
Chan et al.

(10) Patent No.: US 7,863,959 B2
(45) Date of Patent: Jan. 4, 2011

(54) APPARATUS AND METHODS FOR A HIGH-VOLTAGE LATCH

(75) Inventors: Johnny Chan, Fremont, CA (US); Jeffrey Ming-Hung Tsai, San Jose, CA (US); Tin-Wai Wong, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/538,766

(22) Filed: Aug. 10, 2009

(65) Prior Publication Data

US 2009/0295447 A1 Dec. 3, 2009

Related U.S. Application Data

(63) Continuation of application No. 11/470,536, filed on Sep. 6, 2006, now abandoned.

(51) Int. Cl.
*H03K 3/356* (2006.01)
(52) U.S. Cl. .................... 327/208; 365/189.05
(58) Field of Classification Search ................ 327/208; 365/189.05
See application file for complete search history.

(56) References Cited

U.S. PATENT DOCUMENTS

| | | | |
|---|---|---|---|
| 5,298,816 A | 3/1994 | Kaplinsky | |
| 5,629,643 A * | 5/1997 | Moughanni et al. | 327/199 |
| 6,107,852 A * | 8/2000 | Durham et al. | 327/203 |
| 6,157,577 A | 12/2000 | McPartland | |
| 6,188,246 B1 | 2/2001 | Ogawa | |
| 6,288,586 B1 | 9/2001 | Ahn et al. | |
| 6,380,781 B1 * | 4/2002 | Karnik et al. | 327/215 |
| 6,459,301 B2 | 10/2002 | Hidaka | |
| 6,501,315 B1 | 12/2002 | Nguyen | |
| 6,621,318 B1 * | 9/2003 | Burr | 327/218 |
| 6,700,412 B2 | 3/2004 | Takahashi | |
| 7,369,446 B2 * | 5/2008 | Chan et al. | 365/189.05 |
| 7,542,347 B2 * | 6/2009 | Hanzawa et al. | 365/185.2 |
| 2001/0028581 A1 * | 10/2001 | Yanagisawa et al. | 365/189.05 |
| 2004/0135611 A1 | 7/2004 | Tohsche | |

(Continued)

FOREIGN PATENT DOCUMENTS

WO WO-2008030812 A2 3/2008

(Continued)

OTHER PUBLICATIONS

"PCT Application No. PCT/US07/77542, International Search Report mailed Mar. 7, 2008", 3 pgs.

(Continued)

*Primary Examiner*—Lincoln Donovan
*Assistant Examiner*—Ryan C Jager
(74) *Attorney, Agent, or Firm*—Schwegman, Lundberg & Woessner, P.A.

(57) ABSTRACT

Some embodiments include a device having storage node and a latch circuit coupled to the storage node to latch data provided to the storage node during one of a first mode and a second mode of the device. The latch circuit includes a first transistor, a second transistor, and a third transistor coupled between a first voltage node and a second voltage node. The third transistor is configured to selectively turn on and off in the first and second modes. Other embodiments are described.

8 Claims, 6 Drawing Sheets

U.S. PATENT DOCUMENTS

| | | |
|---|---|---|
| 2004/0214389 A1 | 10/2004 | Madurawe |
| 2006/0171194 A1 | 8/2006 | Lowrey et al. |
| 2007/0159873 A1 | 7/2007 | Boemler |
| 2008/0054973 A1* | 3/2008 | Chan et al. ................... 327/208 |
| 2008/0056020 A1* | 3/2008 | Chan et al. ............. 365/189.05 |

FOREIGN PATENT DOCUMENTS

WO     WO-2008030812 A3     3/2008

OTHER PUBLICATIONS

"PCT Application No. PCT/US07/77542, Written Opinion mailed Mar. 7, 2008", 5 pgs.

Nakagome, Y., et al., "Review and Future Prospects of Low-Voltage RAM circuits.", *IBM Journal of Research and Development*, vol. 47(5-6), (Sep. 2003), 525-552.

"U.S. Appl. No. 11/470,536, Final Office Action mailed May 8, 2009", 15 pgs.

"U.S. Appl. No. 11/470,536, Non Final Office Action mailed Nov. 1, 2007", 12 pgs.

"U.S. Appl. No. 11/470,536, Non-Final Office Action mailed May 12, 2008", 11 pgs.

"U.S. Appl. No. 11/470,536, Non-Final Office Action mailed Nov. 25, 2008", 13 pgs.

"U.S. Appl. No. 11/470,536, Preliminary Amendment mailed Sep. 11, 2007", 8 pgs.

"U.S. Appl. No. 11/470,536, Response filed Feb. 25, 2008 to Non Final Office Action mailed Nov. 1, 2007", 13 pgs.

"U.S. Appl. No. 11/470,536, Response filed Feb. 25, 2009 to Non-Final Offce Action mailed Nov. 25, 2008", 14 pgs.

"U.S. Appl. No. 11/470,536, Response filed Sep. 12, 2008 to Non-Final Office Action mailed May 12, 2008", 10 pgs.

\* cited by examiner

Fig._4

APPARATUS AND METHODS FOR A HIGH-VOLTAGE LATCH

RELATED APPLICATIONS

This application is a continuation of U.S. application Ser. No. 11/470,536, filed on Sep. 6, 2006, which is incorporated herein by reference in its entirety.

TECHNICAL FIELD

The present invention relates to high-voltage data latches that are used for writing data into non-volatile memories and, more particularly, to apparatus and a method for limiting leakage current drawn from a high voltage supply or generator, such as an on-chip charge pump circuit that provide a high voltage to the high-voltage data latches during a high-voltage write mode of operation.

BACKGROUND ART

A latch is used to store data bits to be written into preselected memory cells of a non-volatile memory. Except when data bits are being written into the memory cells, the latch is normally supplied with a low-voltage power supply, such as, for example, 3 volts or less. During a write mode of operation, the latch is supplied with a high voltage of 7-15 volts, as required for writing data into the non-volatile memory cells. A single non-volatile memory chip may contain a large number, for example, 512 or more, of high-voltage latch circuits. These latch circuits are typically called high-voltage latch circuits, although a high voltage supply is only required for write operations. An on-chip high-voltage supply or generator, such as a charge pump circuit, provides the high-voltage for writing the data bits into the non-volatile memory cells. The high-voltage generator typically has limited current capability and excessive leakage currents in some of the high-voltage latches may load down the generator so much as to cause the high-voltage level to be less than what is required for proper writing of data bits into the memory cells of the non-volatile memory.

FIG. 1 illustrates a typical cross-coupled high-voltage latch circuit 10 that includes a first CMOS inverter circuit 12 and a second CMOS inverter circuit 14. The first CMOS inverter circuit 12 includes a first pull-up PMOS transistor 16 that has a source connected to a HV node 18 and a drain connected to a latch input node A. The first CMOS inverter circuit 12 also includes a first pull-down NMOS transistor 20 that has a drain connected to the latch input node A and a source connected to ground. The gates of the first pull-up PMOS transistor 16 and the pull-down NMOS transistor 20 are connected together. Note that the HV node 18 is supplied with low voltage except when a write mode of operation occurs.

The second CMOS inverter circuit 14 includes a second pull-up PMOS transistor 22 that has a source connected to the HV node 18 and a drain connected to a data storage output node B. The second CMOS inverter circuit 14 also includes a second pull-down NMOS transistor 24 that has a drain connected to the data storage output terminal B and a source connected to ground. The gates of the second pull-up PMOS transistor 22 and the second pull-down NMOS transistor 24 are connected together.

To enable operation of the high-voltage latch circuit 10 with a normal low Vdd voltage being supplied at the HV node 18, the second pull-down NMOS transistor 24 is a low-threshold voltage Vt, high-voltage NMOS transistor, which tends to have a high leakage current at high write voltages because of its susceptibility to punch through at high voltages. Thus, a leakage path is provided from the HV node 18 to ground through a leaky second pull-down NMOS transistor 24 with a low threshold voltage, Vt.

A reset NMOS transistor 32 is connected between the latch input node A and ground. A HIGH RESET signal is applied to a RESET terminal 34 to turn on the reset NMOS transistor 32 and pull the latch input node A to ground.

The latch input node A is connected through a load input NMOS transistor 26 to a DATA In terminal 28. A LOAD signal is provided at a gate terminal 30 of the load input NMOS transistor 26 to load a data bit at the DATA IN terminal 28 into the latch input node A.

An OUTPUT terminal 36 provides the signal from the latch input node A that is provided to write to the memory.

When the non-volatile chip is not being used in a high-voltage write mode of operation, a Vdd logic-circuit power supply voltage of 3 volts, for example, is provided to the HV node 18 to power the two inverters 12, 14 forming the high-voltage latch 10. When the non-volatile chip is actually being used in a high-voltage write mode of operation, a suitable high-voltage power supply of, for example, 7-15 volts is provided to the HV node 18 to power the two inverters 12, 14 forming the high-voltage latch. The high-voltage is supplied from a high-voltage generation circuit, such as, for example, a charge-pump circuit that is provided on the chip.

In order to provide for proper switching operation of the latch with a low Vdd logic-circuit supply voltage, such as, for example, 3 volts or less, the NMOS transistor 24 is a high-voltage, low Vt threshold device. A low Vt threshold device is required because it is difficult to load a HIGH or "1" level to the latch because of the Vt voltage drop across the load input NMOS transistor 26 that makes it difficult to load a HIGH or "1" level into the latch input node A.

When the chip is in a high-voltage write mode of operation with the HV terminal 18 at 7-15 volts and when the data storage output node B is at a HIGH, "1", logic level, the high-voltage pull-up PMOS transistor 22 is turned on and the high-voltage pull-down, low-threshold voltage NMOS transistor 24 is turned off. This essentially places almost all of the 7-15 volts from the HV terminal 18 across the low-threshold NMOS transistor 24. If the high-voltage pull-down NMOS transistor 24 is leaky because of the presence of a punch through path in it, a leakage path goes from the high voltage at the data storage output node B to ground through the leaky pull-down, low-threshold NMOS transistor 24.

A non-volatile memory chip has 512 or more high-voltage latches like the typical high-voltage latch circuit 10, some or all of which may be leaky with a high voltage at their HV voltage supply terminals. Excessive leakage currents taken from the on-chip high voltage generation circuit, such as, for example, an on-chip charge pump, that supplies a nominal 15 volts, may cause the voltage at the HV terminal 18 to be pulled down to, say, 12 volts. The reduced high voltage at the HV terminal 18 may cause malfunctions in a memory write function.

FIG. 2 is a timing diagram that illustrates operation of the typical high-voltage latch circuit 10 of FIG. 1, when the DATA IN signal at the DATA IN terminal 28 is LOW, or at 0 volts. A LOAD signal is initially at a LOW level at the gate terminal 30 of the NMOS load input transistor 26 to keep the NMOS load input NMOS transistor 26 off. Initially, the RESET signal at terminal 34 is HIGH, which turns on the reset NMOS transistor 32 to pull the latch input node A to ground. The HV_ENABLE signal is initially LOW, which provides a Vdd voltage at terminal 18. When the LOAD signal is raised HIGH to Vdd, the NMOS load input NMOS transistor 26 is turned on to provide a LOW logic level DATA IN signal to the latch input node A and the voltage on the data storage output node B goes HIGH to Vdd. Subsequently, the HV_ENABLE control signal goes high to apply a high voltage HV from a high voltage generation circuit to the HV node 18. The second pull-up PMOS transistor 22 is turned on so that the voltage at the data storage output node B is at essentially the same high voltage as at the HV node 18. The HV voltage at the BV node 18 is initially at a Vdd level. However, after the HV_ENABLE control voltage goes HIGH to connect the high voltage generation circuit to the HV node 18, the HV voltage at node 18 rises to a HV(Actual) level that is less than the full HV(Target) level because of the extra leakage current that the high voltage generation circuit must provide to the leaky pull-down NMOS transistor 24 for a number of such high-voltage latch circuits. The full HV(Target) level is, for example, 15 volts while the HV(Actual) level is, for example, 12 volts due to leakage in various high voltage latch circuits. The voltage at the latch input node A and the OUTPUT terminal 36 remains at a LOW state. The voltage at the data storage node B tracks the HV voltage and only rises to the HV(Actual) level.

FIG. 3 is a timing diagram that illustrates operation of the typical high-voltage latch circuit 10 of FIG. 1, when the DATA IN signal at the DATA IN terminal 28 is HIGH. The LOAD signal is initially at a LOW level at the gate terminal 30 of the NMOS load input transistor 26 to keep the NMOS load input NMOS transistor 26 off. Initially, the RESET signal at terminal 34 is HIGH, which turns on the reset NMOS transistor 32 to pull the latch input node A to ground. The HV_ENABLE signal is initially LOW, which provides a Vdd voltage at terminal 18. When the LOAD signal is raised to Vdd, the load input NMOS transistor 26 is turned on to provide a HIGH logic level DATA IN signal to the latch input node A and the voltage on the data storage output node B goes low to 0 volts when the pull-up PMOS transistor 22 is turned off and the pull-down NMOS transistor 24 is turned on. Subsequently, the HV_ENABLE control signal goes high to apply the high voltage HV from a high voltage generation circuit to the HV node 18. The first pull-up PMOS transistor 16 is turned on so that the voltage at the data storage output node B is LOW. The HV voltage at the HV node 18 is initially at the Vdd voltage level. After the HV_ENABLE control voltage goes high to connect the high voltage generation circuit to the HV node 18, the HV voltage at node 18 rises to the full HV(Target) level because there is no leakage current through the pull-down NMOS transistor 24. The signal at latch input node A and the OUTPUT terminal 36 tracks the HV level at the HV terminal 18.

Various possible remedies for reducing the effect of leakage through the pull-down NMOS transistor 24, when the voltage at the data storage output terminal B is at a high-voltage level, have some disadvantages. Changing the process parameters for fabrication of the pull-down NMOS transistor 24 may reduce leakage; but this can cause its threshold voltage Vt to increase and adversely affect low-voltage operation.

To decrease leakage current, the resistance of the pull-down NMOS transistor 24 can be increased by increasing the gate length L of the pull-down NMOS transistor; but this takes more area on the chip and increases the size of the chip. The current output, or strength, of the HV generation circuit can be increased; but this may require a larger pump circuit, which takes more area on the chip and increases the size of the chip. Increasing the strength of the HV generation circuit may also require a higher clock frequency to provide a greater write current.

SUMMARY OF THE INVENTION

The present invention provides a non-volatile memory having a plurality of high-voltage CMOS latches. Each high-voltage CMOS latch includes a HV terminal that is connected to a Vdd supply voltage during a standby mode of operation and during a load data mode of operation and that receives a HIGH-VOLTAGE supply voltage during a high-voltage write mode of operation. A first CMOS inverter and a second CMOS inverter, each having respective input and output terminals, are each connected between the HV terminal and a ground terminal. The input terminal of the second CMOS inverter and the output terminal of the first CMOS inverter are connected to a latch input node A. The input terminal of the first CMOS inverter and the output terminal of the second CMOS output terminal are connected to a latch output node B.

The first CMOS inverter has a first PMOS pull-up transistor that is connected between the HV terminal and the latch input node A. The first CMOS inverter also has a first NMOS pull-down transistor connected between the latch input node A and the ground terminal. The second CMOS inverter has a second PMOS pull-up transistor connected between the HV terminal and the latch output node B. The second CMOS inverter has a pass-gate high-voltage NMOS transistor with a VT implant connected between the latch output node A and a second high-voltage, low-threshold NMOS pull-down transistor that is connected to the ground terminal. The pass-gate high-voltage NMOS transistor has a gate connected to a STANDBY terminal that receives a HIGH LOGIC signal with a value of at most Vdd to turn on the pass-gate high-voltage NMOS transistor when the high-voltage CMOS latch is in a data-loading mode of operation and during a high-voltage write mode of operation. The pass-gate high-voltage NMOS transistor limits the voltage across the second high-voltage, low-threshold NMOS pull-down transistor and reduces punch-through current and drain-to-substrate leakage of the second high-voltage, low-threshold NMOS pull-down transistor.

Each high-voltage CMOS latch circuit has a DATA IN input terminal connected to the latch input node A through a NMOS load input NMOS transistor at a gate terminal of which is provided a DATA LOAD signal to turn on the NMOS load input NMOS transistor.

Each high-voltage CMOS latch circuit has a reset NMOS transistor that is connected between the latch input node A and the ground terminal and that has a gate terminal at which is provided a HIGH RESET signal to turn on the reset NMOS transistor during the standby mode of operation and at which is provided a LOW RESET signal to turn off the reset NMOS transistor during a data-loading mode of operation and during a high-voltage write mode of operation.

The present invention also provides a method of limiting leakage current in one or more high-voltage latches that are used for high-voltage writing of data into a non-volatile memory. The method includes the steps for each of the one or more latches of: connecting a cross-coupled CMOS latch between a HV terminal and a ground terminal by connecting a first CMOS inverter between a HV terminal and a ground terminal and by connecting a second CMOS inverter between the HV terminal and a ground terminal; connecting an input terminal of the second CMOS inverter and output terminal of the first CMOS to a latch input node A for the latch circuit; connecting the latch input node A through a NMOS load input NMOS transistor to a DATA In input terminal of the latch; providing a LOAD signal at a gate terminal of the NMOS load input NMOS transistor to turn on the NMOS load input NMOS transistor; connecting an input terminal of the first CMOS inverter and an output terminal of the second CMOS output terminal to a latch output node B for the latch circuit; connecting a high-voltage, pass-gate NMOS transistor between the latch output node A and one terminal is a low-threshold NMOS pull-down transistor that has another terminal connected to ground; and limiting the voltage across the second high-voltage, low-threshold NMOS pull-down transistor and the reducing punch through current and drain-to substrate leakage by turning on the pass-gate high-voltage NMOS transistor with a HIGH signal with a value of Vdd at most.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
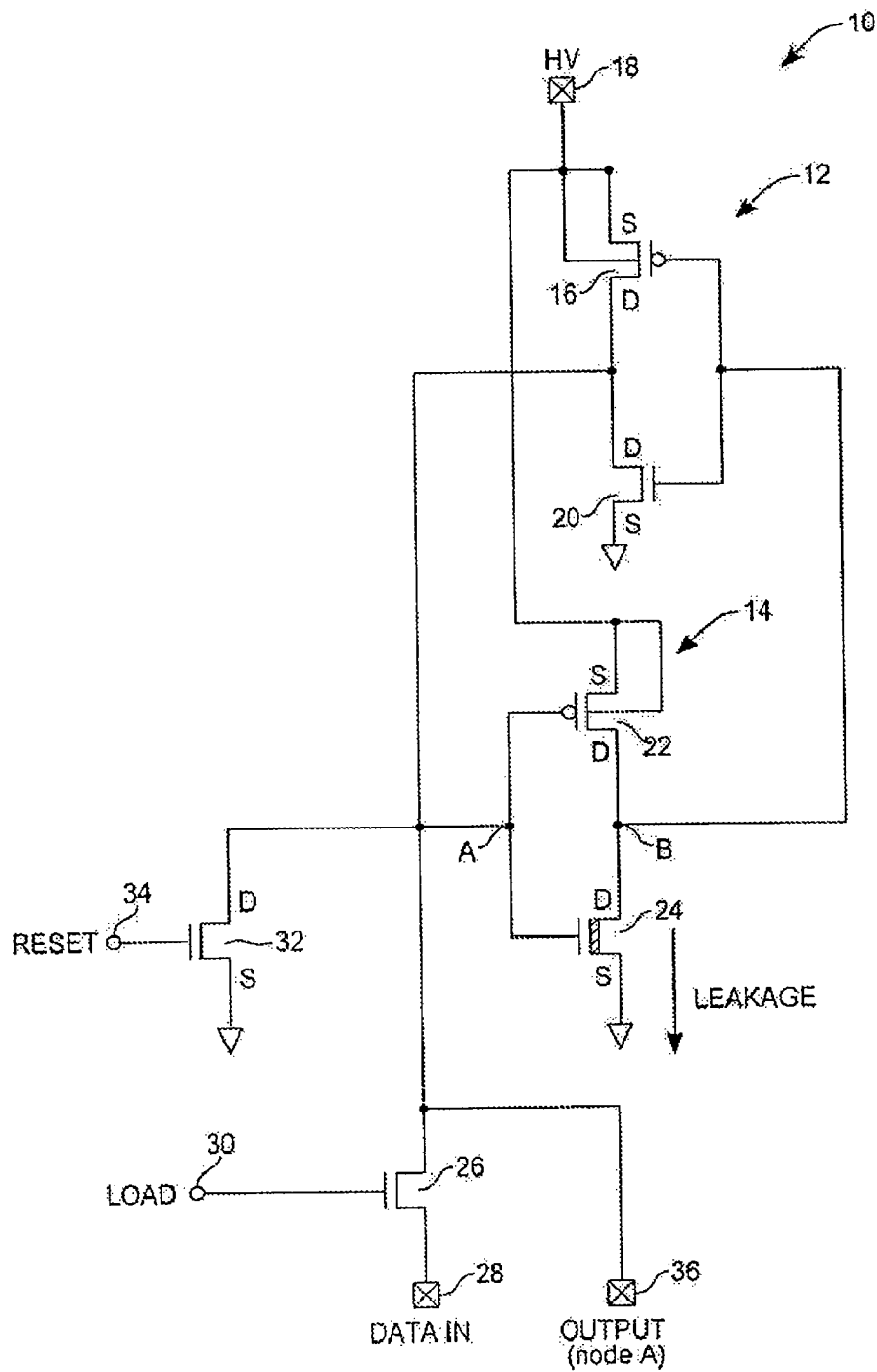
FIG. 1 is a circuit diagram of a prior art high voltage latch circuit having a high-voltage leakage path from an output terminal to ground.
Figure 2:
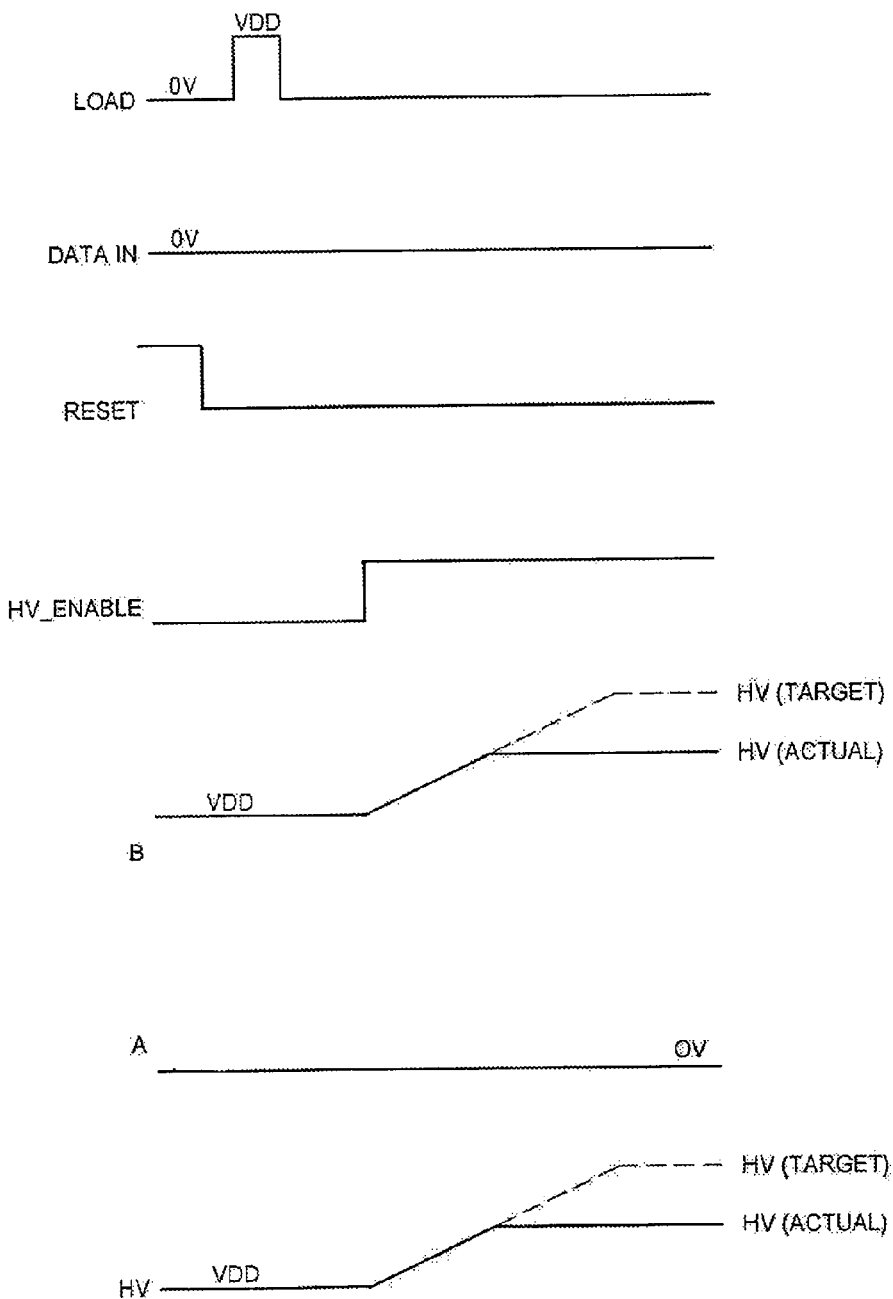
FIG. 2 is a timing diagram for the circuit of FIG. 1 that is loaded with a LOW DATA IN signal.
Figure 3:
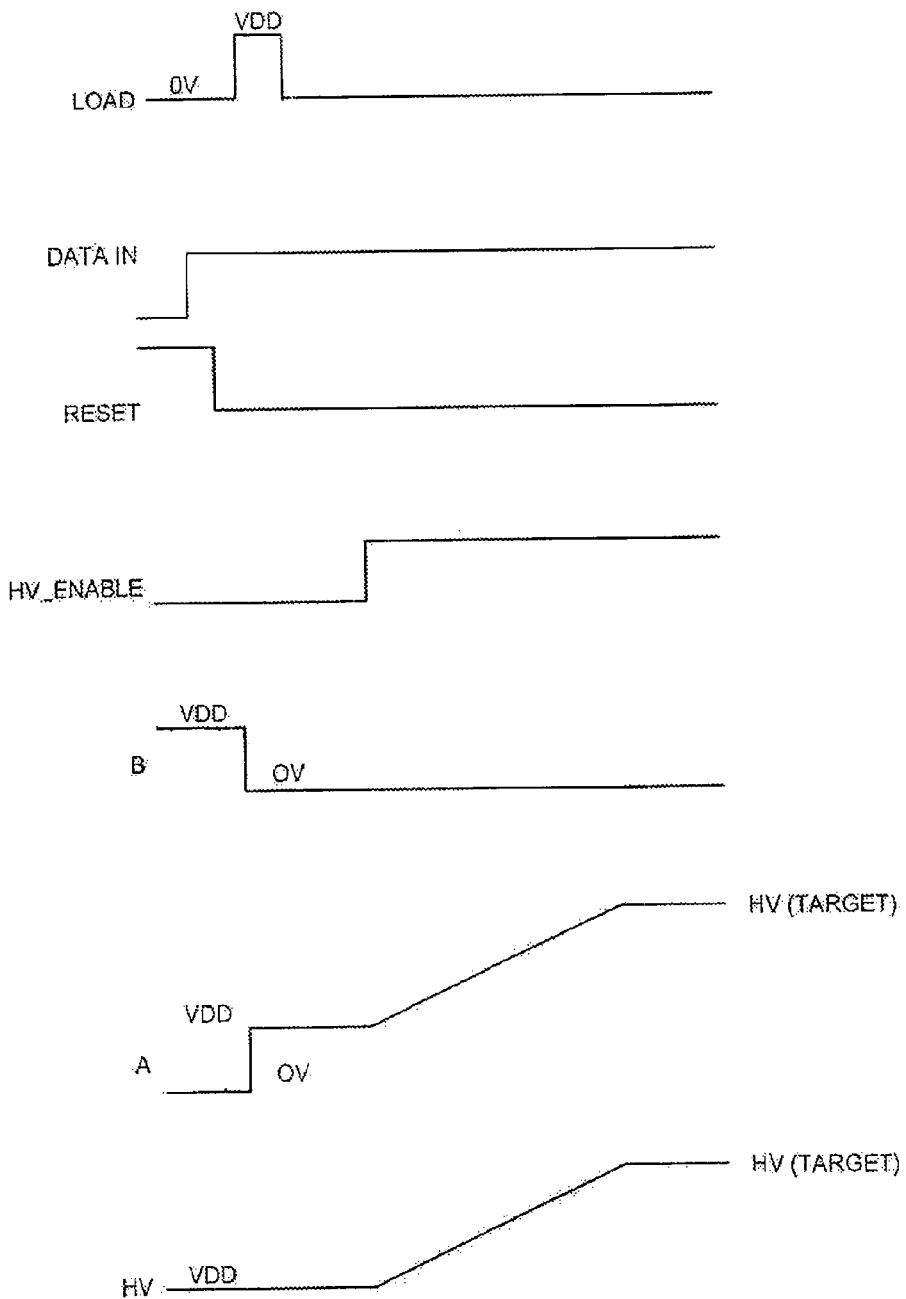
FIG. 3 is a timing diagram for the circuit of FIG. 1 that is loaded with a HIGH DATA IN signal.
Figure 4:
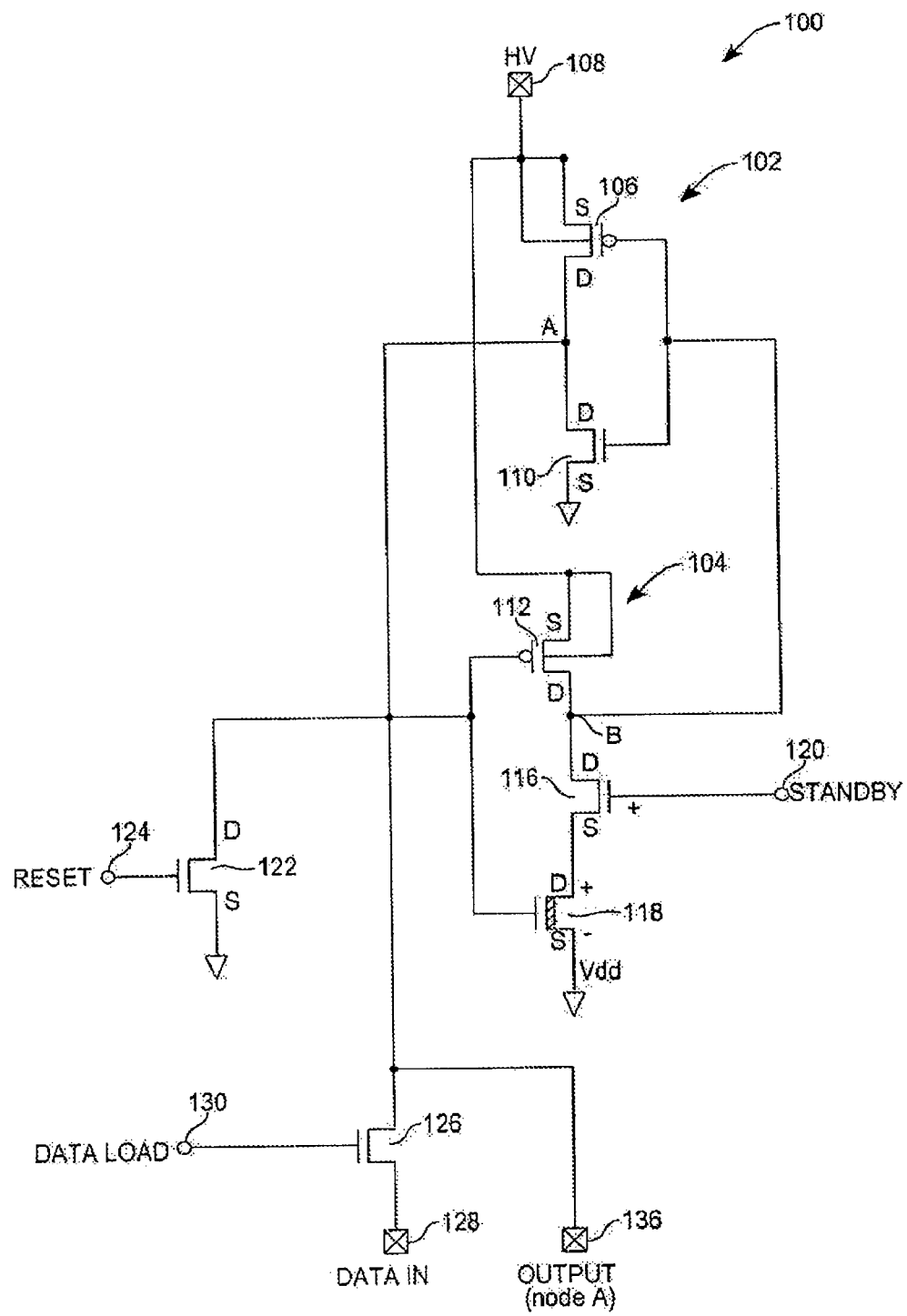
FIG. 4 is a circuit diagram of a high voltage latch circuit according to the present invention.

FIG. 4 illustrates an improved high-voltage latch circuit 100 according to the present invention. The latch circuit includes a first CMOS inverter circuit 102 and a second CMOS inverter circuit 104. The first CMOS inverter circuit 102 includes a first pull-up PMOS transistor 106 that has a source connected to a HV node 108 and a drain connected to a latch input node A. The first CMOS inverter circuit 102 also includes a first pull-down NMOS transistor 110 that has a drain connected to the latch input node A and a source connected to ground. The gates of the first pull-up PMOS transistor 106 and the first pull-down NMOS transistor 110 are connected together.

The second CMOS inverter circuit 104 includes a second pull-up PMOS transistor 112 that has a source connected to the HV node 108 and a drain connected to a data storage output node B. The second CMOS inverter circuit 104 includes a pass-gate high-voltage NMOS transistor 116 with a VT implant that is connected between the latch output node B and a drain of a second high-voltage, low-threshold NMOS pull-down transistor 118 that has a source terminal connected to the ground terminal. The pass-gate high-voltage NMOS transistor 116 has a gate connected to a STANDBY terminal 120 that receives a HIGH LOGIC signal with a value of at most Vdd to turn on the pass-gate high-voltage NMOS transistor when the high-voltage CMOS latch is in a data-loading mode of operation and during a high-voltage write mode of operation.

The STANDBY signal is Low when the memory system is in a standby mode of operation. The STANDBY signal is HIGH when the latch is loading data and during a high-voltage write operation. The STANDBY signal is not a high-voltage signal and is limited to Vdd in its HIGH state. By allowing the STANDBY signal to only reach Vdd, the pass-gate high-voltage NMOS transistor 116 will shut off once the Vg (STANDBY voltage)−Vs (source voltage of transistor 116)−Vt (threshold voltage of transistor 116)=0. This limits the voltage across the second high-voltage, low-threshold NMOS pull-down transistor 118 to be Vdd−Vt. This reduces punch through current and drain-to-substrate leakage of the second high-voltage, low-threshold NMOS pull-down transistor 118.

A reset NMOS transistor 122 is connected between the latch input node A and the ground terminal. A gate terminal of the reset NMOS transistor 122 in connected to a RESET terminal 124, at which is provided a HIGH RESET signal to turn on the reset NMOS transistor 122 during a standby mode of operation. A LOW RESET signal turns off the reset NMOS transistor 122 during a data-loading mode of operation and during a high-voltage write mode of operation.

A load input NMOS transistor 126 is connected between the latch input node A and a DATA IN input terminal 128. A DATA LOAD signal is provided at a DATA LOAD terminal that is connected to a gate terminal of the load input NMOS transistor 126. A HIGH DATA LOAD signal turns on the load input NMOS transistor 126 to connect the DATA IN input terminal to the latch input node A. An output terminal 136 provides the signal from the latch input node A that is provided to write to the memory.

Figure 5:
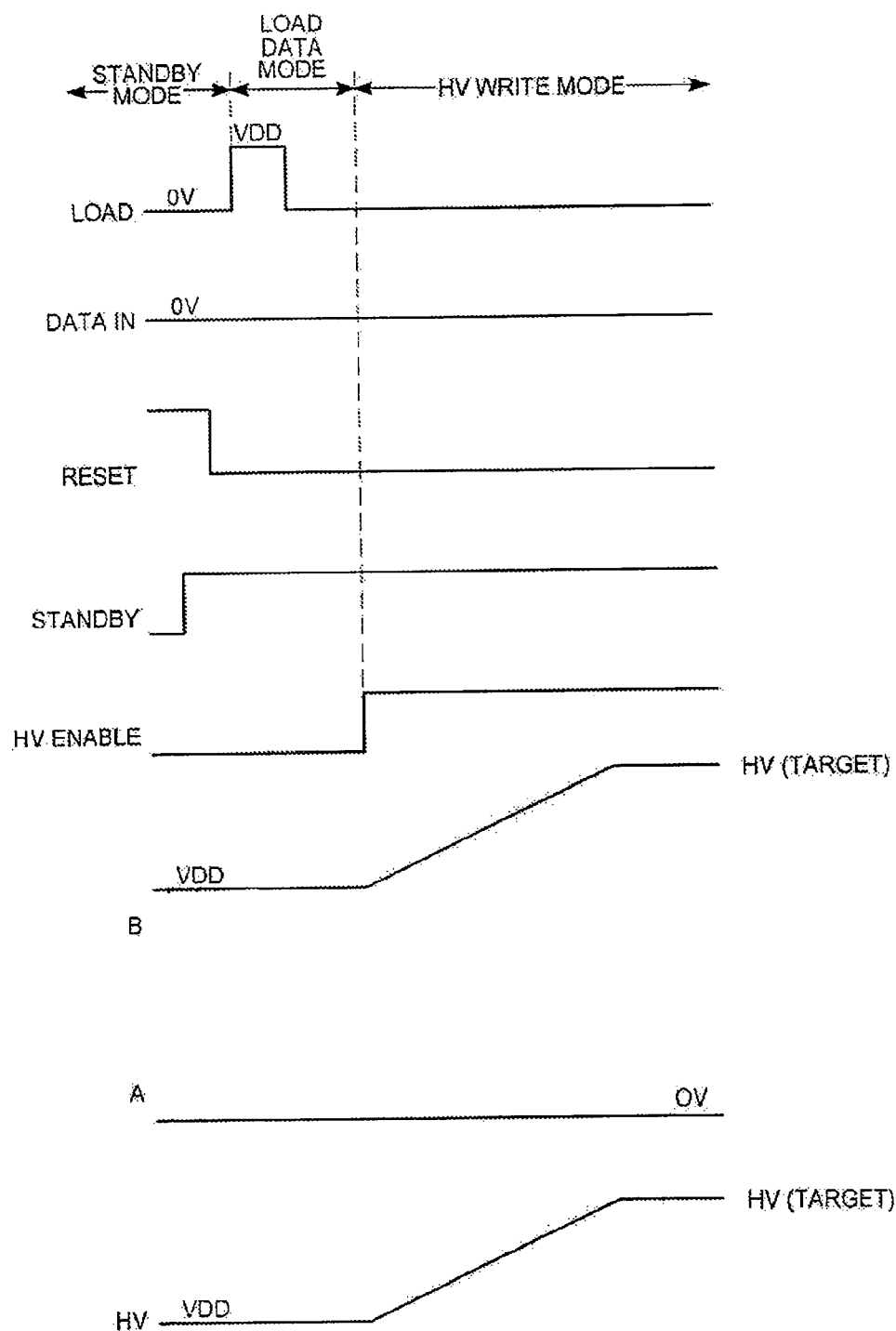
FIG. 5 is a timing diagram for the circuit of FIG. 4 that is loaded with a LOW DATA IN signal.

FIG. 5 is a timing diagram that illustrates operation of the improved high-voltage latch circuit 100 for a LOW DATA IN signal at the DATA IN input terminal 128. The high-voltage latch circuit 100 operates in three modes: a standby mode, a data-loading mode, and a high-voltage write mode. The standby mode of operation occurs when the latch circuit 100 is powered by a LOW Vdd voltage on the HV node 108. The data-loading mode of operation occurs when the input data signal at the DATA IN terminal 128 is loaded into the latch circuit 100 that is still operated with the low Vdd voltage at terminal 108. The high-voltage writer mode of operation occurs when the high voltage is applied to the HV node 108 to write data into the non-volatile memory cells.

Standby Mode

During the standby mode of operation, the STANDBY signal is at a LOW level Vdd to cutoff the pass-gate high-voltage NMOS transistor 116. The HV-ENABLE signal is at a 0 (LOW) level to provide a Vdd voltage at terminal 108. Data at the latch input node A and the data storage output node B is either HIGH or LOW. Prior to the standby mode of operation ending, the STANDBY signal goes to a HIGH signal level to turn on the pass-gate high-voltage NMOS transistor 116. The RESET signal at terminal 124 goes LOW to cut the reset NMOS transistor 122.

Data Load Mode

The data-loading mode of operation begins when the LOAD signal at a Vdd level is provided at the gate terminal 130 of the load input NMOS transistor 126. In this mode of operation, a LOW input signal at the DATA IN terminal 128 is loaded into the latch input node A. This turns on the second pull-up PMOS transistor 112 and turns off the second NMOS pull-down transistor 118 and causes the data storage output node B to go to a HIGH Vdd level.

High-Voltage Write Mode

During the high-voltage write mode of operation, the HIGH STANDBY voltage at input terminal 120 continues to turn on the pass-gate high-voltage NMOS transistor 116. Note that the HIGH state of the STANDBY voltage is at most Vdd. The pass-gate high-voltage NMOS transistor 116 receives the STANDBY signal that has a value of at most Vdd to turn on the pass-gate high-voltage NMOS transistor when the high-voltage CMOS latch is in a data-loading mode of operation and during a high-voltage write mode of operation. The Vdd STANDBY voltage at the gate terminal of the pass-gate high-voltage NMOS transistor 116 limits the voltage across the second high-voltage, low-threshold NMOS pull-down transistor to Vdd–Vt and reduces punch-through current and drain-to-substrate leakage.

During the high-voltage write mode of operation, a high voltage supply is applied to the HV node 108 and the voltage at the data storage output node B follows the voltage on the HV node 108. FIG. 5 shows these two voltages HV and B ramping up to the HV voltage target level, for example, 15 volts. The output voltage at terminal 136 stays at a LOW state.

Figure 6:
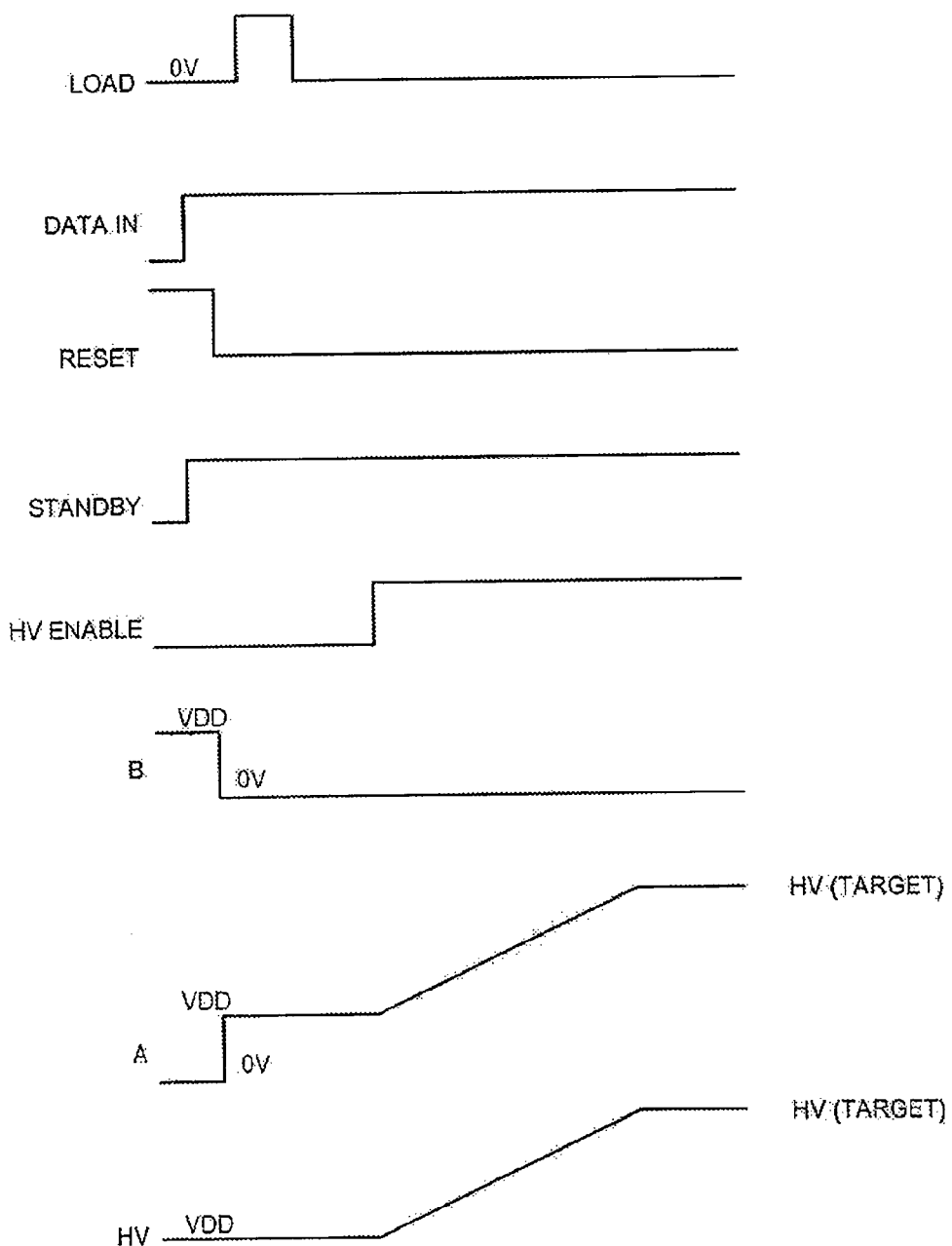
FIG. 6 is a timing diagram for the circuit of FIG. 4 that is loaded with a HIGH DATA IN signal.

FIG. 6 is a timing diagram that illustrates operation of the improved high-voltage latch circuit 100 for a HIGH DATA IN signal at the DATA IN input terminal 128.

Standby Mode

During the standby mode of operation, the STANDBY signal is at a LOW level Vdd to cutoff the pass-gate high-voltage NMOS transistor 116. The HV-ENABLE signal is at a 0 (Low) level to provide a Vdd voltage at terminal 108. Data at the latch input node A and the data storage output node B is either HIGH or LOW. Prior to the standby mode of operation ending, the STANDBY signal goes to a HIGH signal level to turn on the pass-gate high-voltage NMOS transistor 116. The RESET signal at terminal 124 goes LOW to cut the reset NMOS transistor 122.

Data Load Mode

The data-loading mode of operation begins when the LOAD signal at a Vdd level is provided at the gate terminal 128 of the load input NMOS transistor 126. In this mode of operation, a HIGH input signal at the DATA IN terminal 130 is loaded into the latch input node A. This turns off the second pull-up PMOS transistor 112 and which turns on the second NMOS pull-down transistor 118 and causes the data storage output node B to go to a LOW level.

High-Voltage Write Mode

During the high-voltage write mode of operation, the HIGH STANDBY voltage at input terminal 120 continues to turn on the pass-gate high-voltage NMOS transistor 116. Note that the HIGH state of the STANDBY voltage is at most Vdd. The pass-gate high-voltage NMOS transistor 116 receives the STANDBY signal that has a value of at most Vdd to turn on the pass-gate high-voltage NMOS transistor when the high-voltage CMOS latch is in a data-loading mode of operation and during a high-voltage write mode of operation. The Vdd STANDBY voltage at the gate terminal of the pass-gate high-voltage NMOS transistor 116 limits the voltage across the second high-voltage, low-threshold NMOS pull-down transistor to Vdd–Vt and reduces punch-through current and drain-to-substrate leakage.

During the high-voltage write mode of operation, a high voltage supply is applied to the HV node 108 and the voltage at the data storage output node A follows the voltage on the HV node 108. FIG. 6 shows these two voltages HV and A ramping up to the HV voltage target level, for example, 15 volts. Terminal 136 provides the node A voltage as an output signal to write the memory.

The foregoing descriptions of specific embodiments of the present invention has been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalent.

What is claimed is:

1. A device comprising:
a storage node;
a latch circuit coupled to the storage node, the latch circuit to latch data provided to the storage node during one of a first mode and a second mode of the device, the latch circuit including a first transistor coupled between a first voltage node and a second voltage node, a second transistor coupled in series with the first transistor between the first and second voltage nodes, and a third transistor coupled between the first and second transistors and coupled in series with the first and second transistors between the first voltage node and the second voltage node, the third transistor configured to turn on prior to an end of the first mode before the data is provided to the storage node and to stay on during the second mode when the data is provided to the storage node;
a fourth transistor to reset the storage node, the fourth transistor configured to turn off after the third transistor turns on; and
a fifth transistor to pass the data to the storage node, the fifth transistor configured to turn on after the fourth transistor turns off.

2. The device of claim 1, wherein the first, second, and third transistors form a first inverter having an input node coupled to the storage node.

3. The device of claim 2 further comprising a second inverter having an input node coupled to an output node of the first inverter and an output node coupled to the storage node.

4. The device of claim 1, wherein the first mode includes a standby mode of the device.

5. The device of claim 1, wherein the third transistor is coupled between the second storage node and a ground potential.

6. The device of claim 1, wherein the third transistor includes an n-channel metal-oxide semiconductor (NMOS) transistor.

7. The device of claim 1, wherein the fourth transistor is coupled between the first storage node and a ground potential.

8. The device of claim 3, wherein the second inverter includes a pair of transistors coupled between the first voltage node and the second voltage node.

* * * * *